United States Patent [19]

Kishi et al.

[11] Patent Number: 5,783,849

[45] Date of Patent: Jul. 21, 1998

[54] SEMICONDUCTOR DEVICE

[75] Inventors: Toshiyuki Kishi, Tokorozawa; Takashi Toida, Tokyo, both of Japan

[73] Assignee: Citizen Watch Co., Ltd., Tokyo, Japan

[21] Appl. No.: 804,427

[22] Filed: Feb. 21, 1997

[30] Foreign Application Priority Data

Feb. 23, 1996 [JP] Japan .................. 8-035934

[51] Int. Cl.$^6$ .................................. H01L 29/72
[52] U.S. Cl. .................. 257/315; 257/316; 257/324; 257/368; 257/386; 257/394; 257/618; 257/750; 257/773
[58] Field of Search .................. 257/315, 316, 257/324, 368, 386, 394, 618, 750, 773

[56] References Cited

U.S. PATENT DOCUMENTS 5,698,872  12/1997  Takase et al. .................. 257/315

FOREIGN PATENT DOCUMENTS 56-111261  9/1981  Japan .

*Primary Examiner*—Edward Wojciechowicz
*Attorney, Agent, or Firm*—Armstrong, Westerman, Hattori, McLeland & Naughton

[57] ABSTRACT

On a semiconductor substrate (1) is provided an insulator film, on which is formed a lower gate electrode including a first lower gate electrode (5a) and a second lower gate electrode (5b), on which lower gate electrode is formed a lower gate insulator film. On the lower gate insulator film is disposed a device region (9), on which is disposed an upper gate electrode (13) by way of an upper gate insulator film. The device region (9) has island-shaped patterns. The first lower gate electrode (5a) is placed in substantially the middle part of the device region (9), while the second lower gate electrode (5b) is provided in parallel with the first lower gate electrode (5a) and at a boundary between the device region (9) and the insulator film. The upper gate electrode (13) is positioned orthogonal to the lower gate electrodes (5a, 5b). This configuration will make it possible to inhibit the occurrence of current leakage due to parasitic transistors.

18 Claims, 15 Drawing Sheets

SEMICONDUCTOR DEVICE

BACKGROUND OF THE INVENTION

1. Field of the Invention

The present invention relates generally to a semiconductor device, and more particularly to a semiconductor device such as a field effect transistor (FET) that has an upper gate electrode and a lower gate electrode respectively above and below a device region acting as an active region formed on top of an insulator film superposed on a semiconductor substrate.

2. Description of the Related Art

Japanese Patent Laid-Open Publication No. 56-111261, for example, describes a semiconductor device which has the upper gate electrode and the lower gate electrode respectively above and below a device region formed on top of the insulator film superposed on the semiconductor substrate so that it may enjoy inhibited short-channel effects, improved sub-threshold characteristics, and high mobility.

With reference to FIG. 38, an example of the conventional semiconductor device is described below. FIG. 38 is a plan view which shows a conventional type FET which has the upper gate electrode and the lower gate electrode respectively above and below a device region.

As shown in FIG. 38, this FET has on top of its insulator film superposed on the substrate (not shown) a device region 50 that is island-shaped, above and below which are formed an upper gate electrode 52 and a lower gate electrode 51 respectively. Although not shown, an upper gate insulator film is formed between the upper gate electrode 52 and the device region 50, and a lower gate insulator film is formed between the lower gate electrode 51 and device region 50.

A source region 53 and a drain region 54 are formed on both sides of the gate region of the device region 50 sandwiched between the lower gate electrode 51 and the upper gate electrode 52.

Reference numerals 55a to 55d indicated by imaginary lines denote contact holes to be formed in an inter-layer insulator film overlying those entire surfaces.

In such a structure of the FET, a mis-alignment between the upper gate electrode 52 and the lower gate electrode 51 will give rise to capacitance in a region that is not covered by neither the electrode 52 nor the electrode 51, increasing parasitic resistance. To guard against this, as shown in FIG. 38, the prior art, taking into consideration the mis-alignment by the step and repeat system, makes in the design the width (gate length) of the lower gate electrode 51 rather large as compared to that of the upper gate electrode 52, to inhibit the above-mentioned capacitance from being formed and also to cause lower gate electrode 51 to control the entire channel region formed below the upper gate electrode 52.

The FET shown in FIG. 38 will inhibit the short-channel effects and enjoy improved sub-threshold characteristics and even higher mobility.

However, this FET develops parasitic transistors at a region edge 50a of the device region 50 which has island-shaped patterns.

The parasitic transistor thus formed at the edge 50a has a threshold voltage lower than that of the FET formed in the main surface of the region 50 because of its depletion shift. Therefore, the parasitic transistors start to act before the region 50's main FET starts to do so.

This produces a current leakage due to the parasitic transistors at the edge 50a, thus preventing prescribed actions of the semiconductor devices.

SUMMARY OF THE INVENTION

It is therefore an object of the present invention to prevent current leakage from occurring due to parasitic transistors.

To this end, the present invention has such a structure as described below that it has on its substrate an insulator film, on which is formed a lower gate electrode, on which is formed a lower gate insulator film, on which is formed a device region, on which is formed a upper gate insulator film, on which is formed an upper gate electrode.

The above-mentioned device region has island-shaped patterns, while the above-mentioned lower gate electrode comprises a first lower gate electrode and a second lower gate electrode; the former being provided in substantially the middle part of this device region and the latter provided parallel to the former and in the boundary region between the device region and the insulator film. The upper gate electrode is orthogonal to the lower gate electrode.

In a semiconductor device of such a structure, a bias voltage is applied to the second lower gate electrode, which covers the boundary region between the device region and the insulator film, so that the threshold voltage of the parasitic transistors may be enhanced.

Further, a bias voltage controlling a threshold voltage of the FET formed in the main surface of the device region, is applied onto the first lower gate electrode provided in substantially the middle part of the device region.

That is, to assure the prescribed actions of a semiconductor device of interest during its operation, different values of bias voltage are applied onto the first lower gate electrode and the second lower gate electrode, thus inhibiting current leakage due to parasitic transistors formed at the edge of the device region.

It is to be appreciated that in the case where the first and second lower gate electrodes have different conduction types from each other, current leakage due to the parasitic transistors can be inhibited even if the same bias voltage is applied to both of the electrodes.

The above and other objects, features, and advantages of the invention will be apparent from the following detailed description which is to be read in conjunction with the accompanying drawings.

DETAILED DESCRIPTION OF THE PREFERRED EMBODIMENTS

Preferred embodiments of the present invention will now be described with reference to the accompanying drawings.

Figure 1:
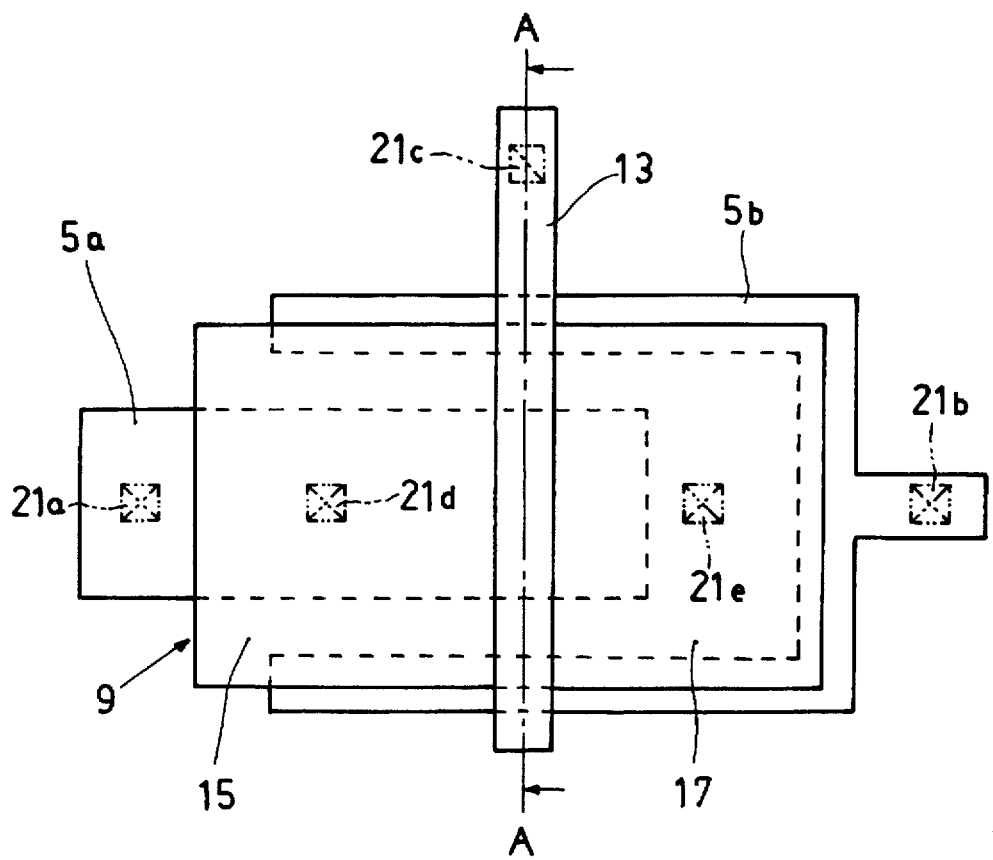
FIG. 1 is a top plan view illustrating a layout of a device region, a lower gate electrode and an upper gate electrode of a semiconductor device according to a first embodiment of the present invention.
Figure 2:
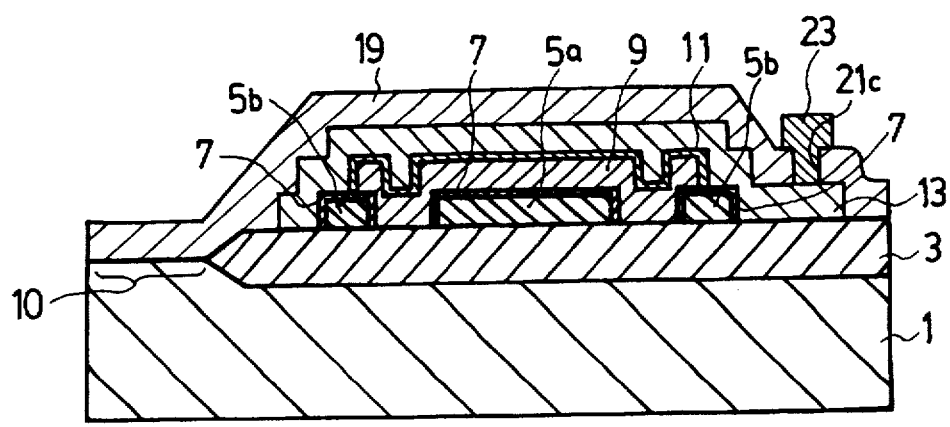
FIG. 2 is a cross-sectional view of the entire semiconductor device taken along the line A—A of FIG. 1.
Figure 3:
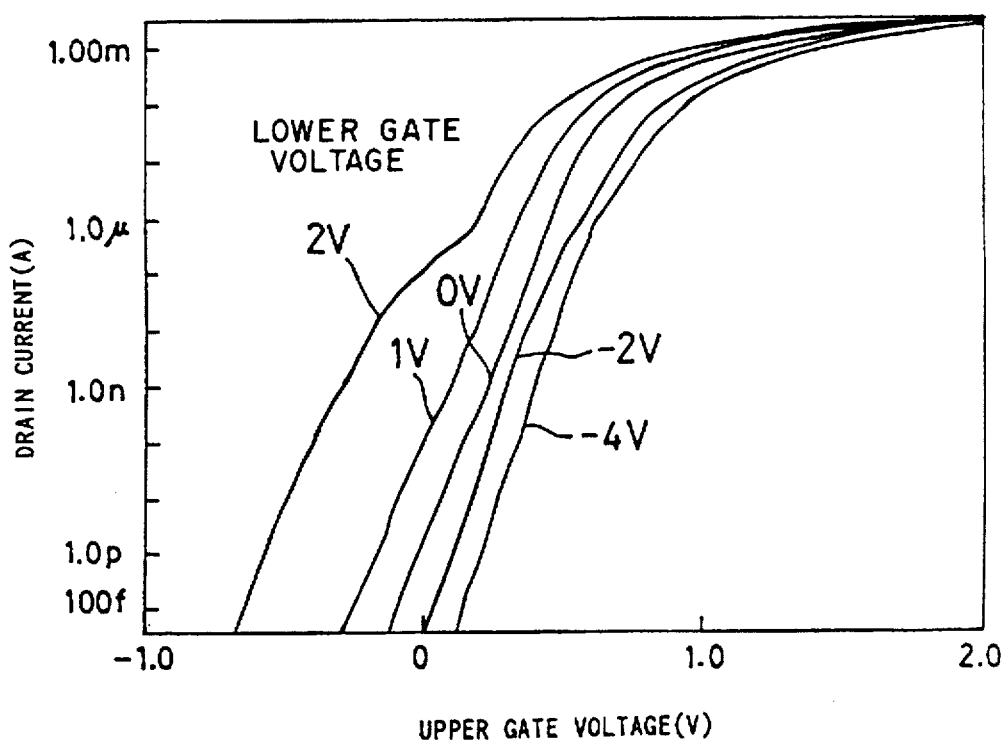
FIG. 3 is a diagram showing the relationship between the upper gate electrode and the drain current, with the lower gate voltage as a parameter in an N channel-type semiconductor device according to the present invention.

[Semiconductor Device of First Embodiment: FIGS. 1 to 3]

First, the structure of a semiconductor device in accordance with a first embodiment of the present invention is described with reference to FIGS. 1 and 2.

FIG. 1 is a plan view illustrating a relationship of arrangement of a device region, a lower gate electrode and an upper gate electrode of the semiconductor device according to the first embodiment of the present invention, and FIG. 2 is a cross-sectional view of the entire semiconductor device taken along a line A—A of FIG. 1. The plan view shown in FIG. 1 is common to the semiconductor devices according to embodiments described hereinbelow.

The semiconductor device in accordance with the first embodiment includes, as shown in FIG. 2, an insulator film 3 made of silicon oxide, selectively formed on a semiconductor substrate 1. On the insulator film 3 are formed FETs and other active elements as well as passive elements as described hereinbelow.

On the insulator film 3 is formed the lower gate electrode which consists of a first lower gate electrode 5a and a second lower gate electrode 5b. That is, as shown in FIG. 1, there are provided the first lower gate electrode 5a having a rectilinear pattern and the second lower gate electrode 5b having a pattern which extends in parallel with the first lower gate electrode 5a and surrounds the outer region thereof.

Furthermore, a lower gate insulator film 7 is formed on top of a surface of the lower gate electrode consisting of the first lower gate electrode 5a and the second lower gate electrode 5b. This lower gate insulator film 7 is made of silicon oxide or silicon nitride.

A device region 9 is provided on top of the upper surfaces of the lower gate insulator film 7 and the insulator film 3. This device region 9 is made of monocrystalline silicon. Reference numeral 10 denotes a seed region for forming the device region 9.

This device region 9 is, as shown in FIG. 1, island-patterned in such a manner that its width-directional middle part is positioned on the lower gate electrode 5a and its both edges are positioned on the second lower gate electrode 5b. As a result of this, the second lower gate electrode 5b is provided along two sides, opposing each other, of the boundary region between the device region 9 and the insulator film 3.

Moreover, an upper gate insulator film 11 shown in FIG. 2 is superposed on the entire surface of the device region 9.

An upper gate electrode 13 is provided on top of the upper gate insulator film 11 so as to traverse the device region 9. The upper gate electrode 13 is, as shown in FIG. 1, arranged in such a direction as to be orthogonal to both the first lower gate electrode 5a and the second lower gate electrode 5b. Furthermore, a source region 15 is provided on one side of the device region 9 relative to the upper gate electrode 13, with a drain region 17 on its other side.

Then, an inter-layer insulator film 19 is disposed over the entire surface of the semiconductor substrate 1 including those regions.

The inter-layer insulator film 19 has therein contact holes 21a to 21e, through which wiring 23 extends, connected respectively with the first lower gate electrode 5a, the second lower gate electrode 5b, the upper gate electrode 13, the source region 15 and drain region 17 of the device region 9.

Although only one semiconductor device is shown in FIGS. 1 and 2, a multiplicity of such semiconductor devices, FETs are formed in practice on the common semiconductor substrate 1.

Description will now be given of a method of driving this semiconductor device.

FIG. 3 is a characteristic diagram showing an upper gate voltage vs. drain current relationship in the case where a lower gate voltage applied onto the lower gate electrodes 5a and 5b of an N channel-type semiconductor device according to the present invention is changed to 2V, 1V, 0V, −2V, and −4V sequentially as a parameter.

The abscissa of FIG. 3 gives the upper gate voltage applied onto the upper gate electrode 13 and the ordinate, the log drain current.

As can be seen from FIG. 3, if a negative bias voltage is applied to the lower gate electrode, the characteristics shift toward an enhancement region, increasing the threshold voltage. If a positive bias voltage is applied to the lower gate electrode, the characteristics shift toward a depletion region, decreasing the threshold voltage. The characteristics are opposite for P channel-type semiconductor devices.

In consideration of such a phenomenon, in an FET like such a semiconductor device, the following bias voltage will be applied to the first lower gate electrode 5a and the second lower gate electrode 5b.

In this FET, the second lower gate electrode 5b is used to prevent parasitic transistors from being formed at the edges of the device region 9.

To this end, to the second lower gate electrode 5b, a negative bias voltage is applied in N channel-type FETs and positive bias voltage, in P channel-type FETs. As a result, the characteristics of the parasitic transistors shift toward an enhancement region, thus increasing the threshold voltage.

Also, the first lower gate electrode 5a provided in the middle part, in the width direction, of the device region 9 is used so as to control the FET's threshold voltage, using the upper gate electrode 13.

That is, to the first lower gate electrode 5a, a positive bias voltage is applied in N channel-type FETs and a negative bias voltage, in P channel-type FETs. As a result, the first lower gate electrode 5a has channels formed also around itself, to lower the FET's threshold voltage for the improvements of the current driving capacity.

In this manner, to the second lower gate electrode 5b so placed as to cover the edges of the device region 9, such a bias voltage is applied as to shift the threshold voltage of the parasitic transistors toward the enhancement region. Also, to the first lower gate electrode 5a placed approximately in the middle part of the device region 9, bias voltage is applied to control the threshold voltage of the FETs in the channel region of the device region 9.

That is, different polarities of bias voltage are applied to the first and second lower gate electrodes 5a and 5b.

As a result, the threshold voltage of the parasitic transistors formed at the edges of the device region 9 increases, inhibiting current leakage due to parasitic transistors to assure prescribed operations of the FETs all the time.

[Method of Manufacturing the Above Semiconductor Device: FIGS. 1, 2, and 4 to 21]

A method of manufacturing the above-mentioned semiconductor device is described below with reference to a plan view of FIG. 1, a cross-sectional view of FIG. 2, and FIGS. 4 through 21 showing the manufacturing processes.

Figure 4:
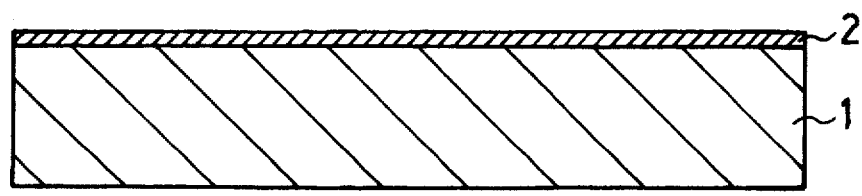
FIGS. 4 to 21 are cross-sectional views illustrating processes for explaining a method of manufacturing the semiconductor device according to the first embodiment of the present invention.

First, the semiconductor substrate 1, shown in FIG. 4, made of monocrystalline silicon is oxidized, to form a pad oxide film 2 with a film thickness of 20 nm on the entire surface of substrate 1.

Figure 5:
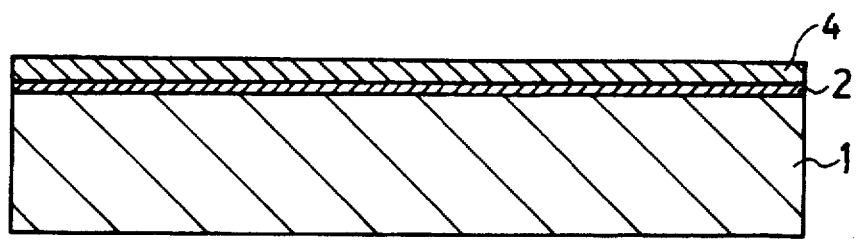

Next, as shown in FIG. 5, an oxidation-resistant film 4 made of silicon nitride with a film thickness of 100 nm is formed on the entire surface of the pad oxide film 2. Specifically, the oxidation-resistant film 4 made of silicon nitride is formed by the chemical vapor deposition (CVD) method in an atmosphere of a mixed gas of dichlorosilane ($SiH_2Cl_2$) and ammonia ($NH_3$) as a reaction gas at a temperature of 700° C.

Figure 6:
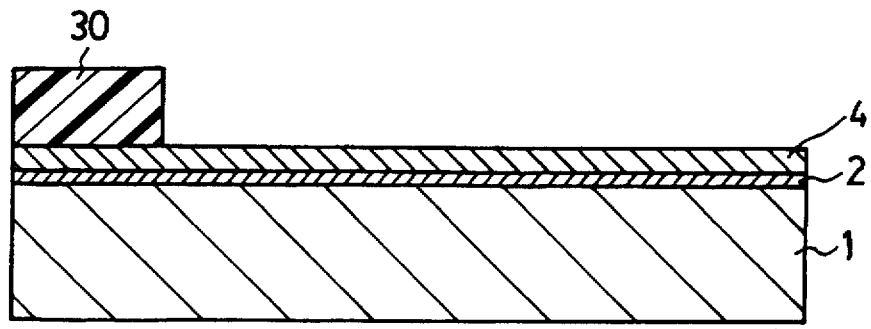

A photoreactive resin (photoresist) 30 is then formed on the entire oxidation-resistant film 4 by the rotational application method. Then, prescribed photomasks are used to perform the photoetching processes consisting of exposure and development. The photoreactive resin 30 is thus patterned so as to form openings in the regions which correspond to those where the insulator film 3 shown in FIG. 2 is provided. This step is shown in FIG. 6.

Subsequently, the thus patterned photoreactive resin 30 is used as an etching mask to etch and remove the portions of the oxidation-resistant film 4 where insulator film 3 is expected to be formed. Specifically, the oxidation-resistant film 4 is etched by the reactive ion etching system using, as an etching gas, a mixed gas of trifluoromethane ($CHF_3$), hexafluorosulfur ($SF_6$), and helium (He).

Figure 7:
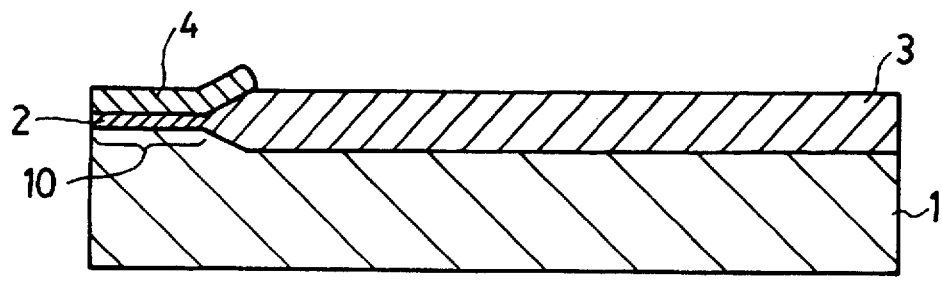

Then, the photoreactive resin 30 is removed and then oxidation-resistant film 4 is used as an oxidation preventing film to perform local oxidation in order to form an oxidized silicon film in the portions where this oxidation-resistant film 4 is not formed, so that the insulator film 3 is formed as shown in FIG. 7. The insulator film 3 made of oxidized silicon is formed up to a thickness of the order of 500 nm specifically in the oxidation process where it is oxidized in the atmosphere of a mixed gas of oxide and hydrogen at a temperature of 1000° C. The portions where the pad oxide film 2 remained in this process act as the seed region 10.

Figure 8:
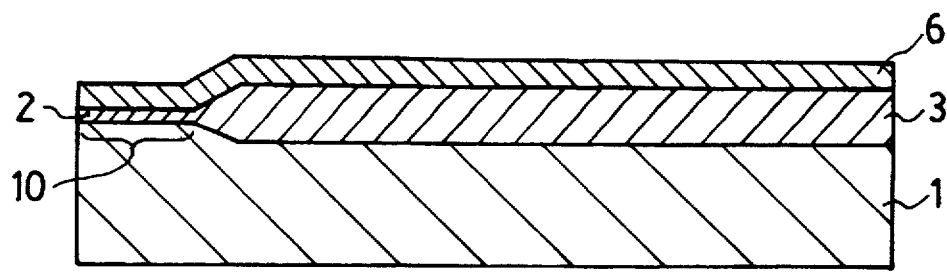

The oxidation-resistant film 4 is then removed with phosphoric acid ($H_3PO_4$) heated to 150° C. Afterward, as shown in FIG. 8, polycrystalline silicon is formed on the entire surface of the film 2 as the lower gate electrode material 6. This lower gate electrode material 6 made of polycrystalline silicon is formed up to a film thickness of the order of 250 nm by the CVD method using monosilane ($SiH_4$) as a reaction gas.

The ion implantation system is then used to implant N-type ions as much as $1\times10^{16}$ atoms/$cm^2$ into the lower gate electrode material 6. Therefore, the lower gate electrode material 6 results in an N-type semiconductor.

Figure 9:
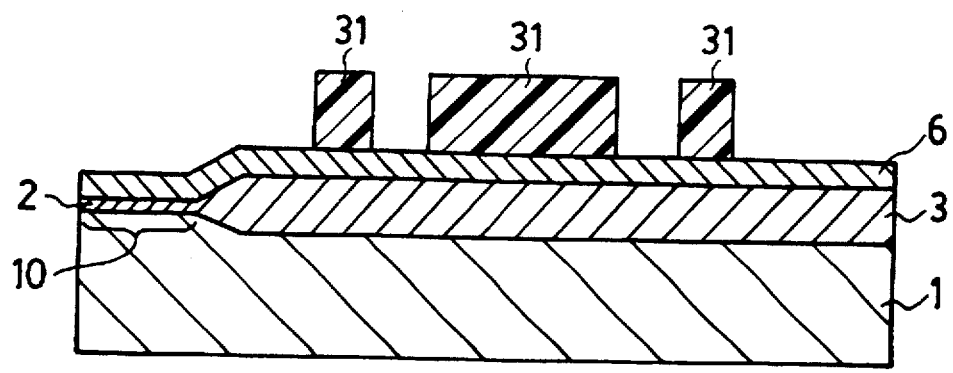

A photoreactive resin 31 is then formed on the entire surface of the lower gate electrode material 6 by the rotational application method, whereupon a prescribed mask is used to perform photoetching processes consisting of exposure and development, for patterning so that the photoreactive resin 31 may be formed in the portions which correspond to the regions where the lower gate electrode is expected to be formed. This step is shown in FIG. 9.

Figure 10:
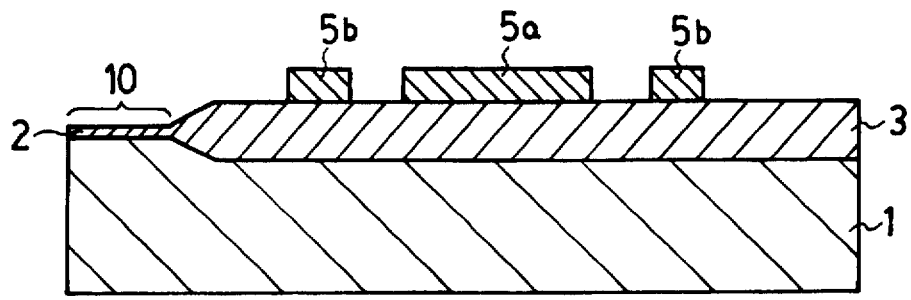

The thus-patterned photoreactive resin 31 is then used as an etching mask in the etching of lower gate electrode material 6, to form the first lower gate electrode 5a and the second lower gate electrode 5b as shown in FIG. 10.

The lower gate electrode material 6 made of a polycrystalline silicon film given to form the first and second lower gate electrodes 5a and 5b is etched in patterns by the reactive ion etching system using as an etching gas a mixed gas of hexafluorosulfur ($SF_6$), chlorine ($Cl_2$), and difluoromethane ($CH_2F_2$).

In this process, the first lower gate electrode 5a is formed into straight-line patterns, while the second lower gate electrode 5b is formed into such patterns as to be parallel to and surrounding the first lower gate electrode 5a.

Figure 11:
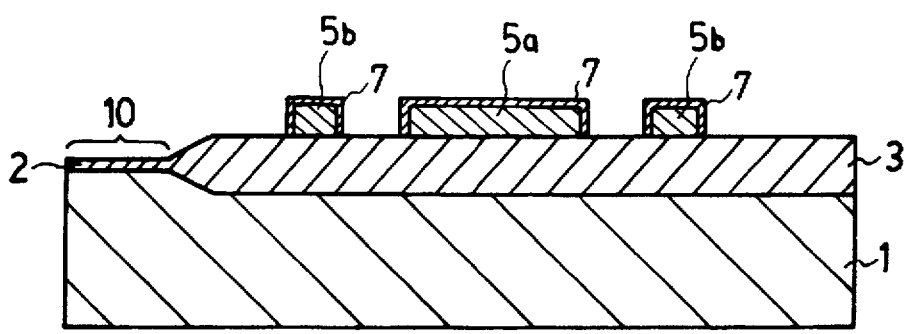

Oxidation is then performed to form the lower gate insulator film 7 made of silicon oxide on, as shown in FIG. 11, the upper surfaces of the first and second lower gate electrodes 5a and 5b. The lower gate insulator film 7 is made of silicon oxide and specifically formed, by oxidization, up to a thickness of 10 nm in the atmosphere of a mixed gas of oxygen and nitrogen.

Figure 12:
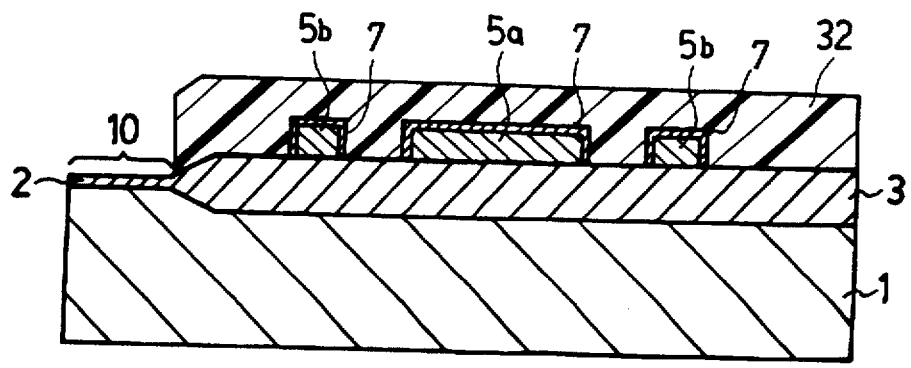
Figure 13:
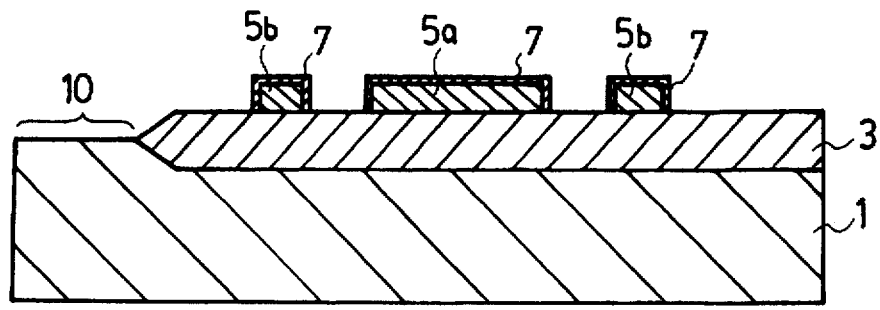

Afterward, as shown in FIG. 12, a photoreactive resin 32 is used to mask the portions other than the seed region 10 on the semiconductor substrate 1. Then, the pad oxide film 2 formed in the seed region 10 is removed with a buffered hydrofluoric acid which is a mixed solution of hydrogen fluoride acid (HF) and ammonium fluoride ($NH_4F$), to expose the portions of semiconductor substrate 1 which exist in the seed region 10 as shown in FIG. 13.

A vacuum CVD system is used thereafter to evacuate down to $1\times10^{-5}$ Torr to introduce into it a mixed gas of chlorine ($Cl_2$) and hydrogen ($H_2$), whereupon the semiconductor substrate 1 is allowed to stand 10 minutes under the conditions of a pressure of 0.3 Torr and a temperature of 570° C., to clean the seed region 10. By this cleaning process, the semiconductor substrate 1's portions in the seed region 10 are etched, allowing exposure of the cleaned surfaces of the substrate 1.

Figure 14:
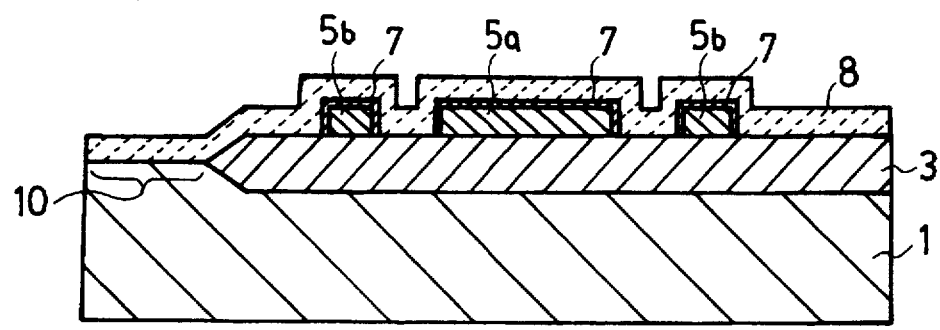

After this cleaning process, the semiconductor substrate 1 undergoes consecutive processing in the same vacuum CVD system, without being removed from it into the atmosphere, using monosilane ($SiH_4$) as a reaction gas under the conditions of a pressure of 0.3 Torr and a temperature of 570° C., to form a nonmonocrystalline silicon film 8 on the entire surface of the substrate 1 as shown in FIG. 14. The nonmonocrystalline silicon film 8, which acts as a device region in which FETs are to be formed, is formed up to a thickness of 1000 nm.

The semiconductor substrate 1 undergoes heat treatment for 10 hours at a temperature of 570° C. in the atmosphere of nitrogen having a flow rate of 2000 cc/m and then consecutively undergoes two hours of heat treatment at a temperature of 1000° C. That is, the substrate 1 undergoes two steps of heat treatment at temperatures of 570° C. and 1000° C.

Figure 15:
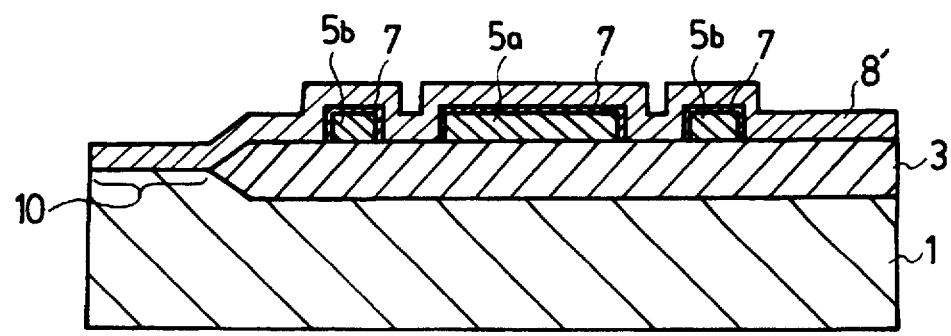

This heat treatment causes nonmonocrystalline silicon film 8 having an unstable bonding distance and angle between silicon atoms themselves to use as a seed crystal the seed region 10 of the semiconductor substrate 1 made of monocrystalline silicon having inter-silicon-atom location as a crystal, in order to grow as a crystal continuous film by the movement and relocation of the silicon particles at the boundary therebetween. As a result, the nonmonocrystalline silicon film 8 can be transformed into a monocrystalline silicon film 8' as shown in FIG. 15.

The semiconductor substrate 1 undergoes oxidation processing at a temperature of 1000° C. in the atmosphere of a mixed gas of oxygen and hydrogen, to form a silicon oxide film having a thickness of the order of 1400 nm on monocrystalline silicon film 8'.

The silicon oxide film is then removed with buffered hydrofluoric acid which is a mixed solution of hydrogen fluoride acid (HF) and ammonium fluoride ($NH_4F$). As a result, the thickness of the monocrystalline silicon film 8' becomes 300 nm approximately.

Figure 16:
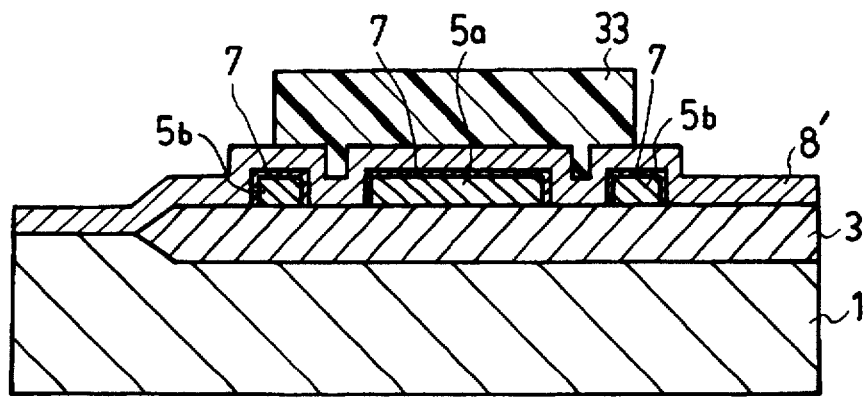

A photoreactive resin 33 is formed on the entire surface of the monocrystalline silicon film 8' by the rotational application method. Then, a prescribed photomask is used to perform photoetching processes comprising exposure and development, to form the photoreactive resin 33, as shown in FIG. 16, in the portions which correspond to the area where device region is expected to be formed in patterning.

Figure 17:
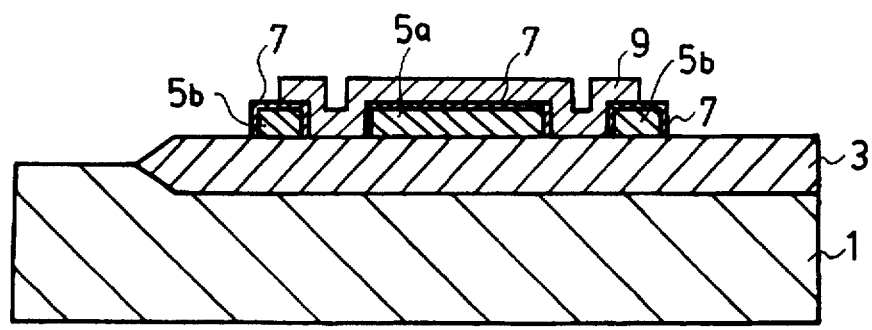

The thus-patterned photoreactive resin 33 is used as an etching mask to etch the monocrystalline silicon film 8', so that the device region 9 is formed as shown in FIG. 17. The monocrystalline silicon film 8' is specifically etched by the reactive ion etching system, using as an etching gas a mixed gas of sulfur hexafluoride ($SF_6$) and oxygen ($O_2$).

During this process, device region 9 is patterned, as shown in the plan view of FIG. 1, in such a way that its width-directional middle part is located on the lower gate electrode 5a and its edges are located on the lower gate electrode 5b.

Boron, i.e. a P-type impurity is then implanted on the entire device region 9 comprising the monocrystalline silicon film 8' at an ion implantation rate of $5 \times 10^{12}$ atoms/$cm^2$. As a result, the entire device region 9 becomes a P-type semiconductor.

Figure 18:
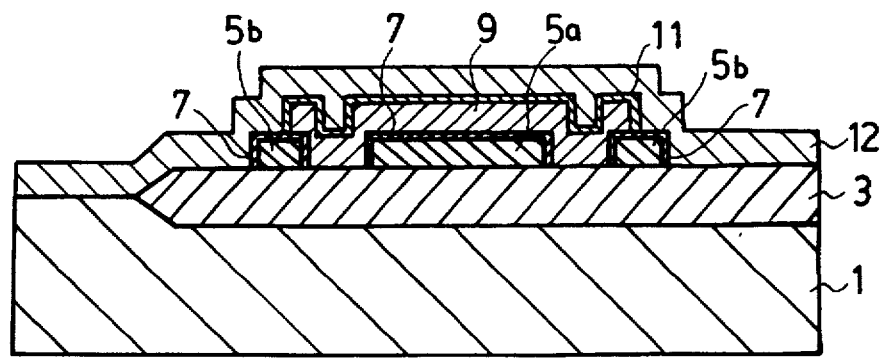

On the upper surfaces of the device region 9 is then formed the upper gate insulator film 11 as shown in FIG. 18. The upper gate insulator film 11 is specifically made of a 10 nm thick silicon oxide film formed on the device region 9 through oxidation in the atmosphere of a mixed gas of hydrogen and nitrogen.

On the entire surface of the semiconductor substrate 1 is then formed a polycrystalline silicon film which acts as an upper gate electrode material 12. The upper gate electrode material 12 made of this polycrystalline silicon film is specifically formed up to a thickness of 300 nm in the CVD system, using monosilane ($SiH_4$) as a reaction gas. This step is shown in FIG. 18.

A photoreactive resin (not shown) is then formed on the entire upper surface of the upper gate electrode material 12 by the rotational application method. Then, a prescribed mask is used to perform photoetching processes comprising exposure and development so that a photoreactive resin may be patterned in the portions which correspond to the area where the upper gate electrode 13 is expected to be formed.

Figure 19:
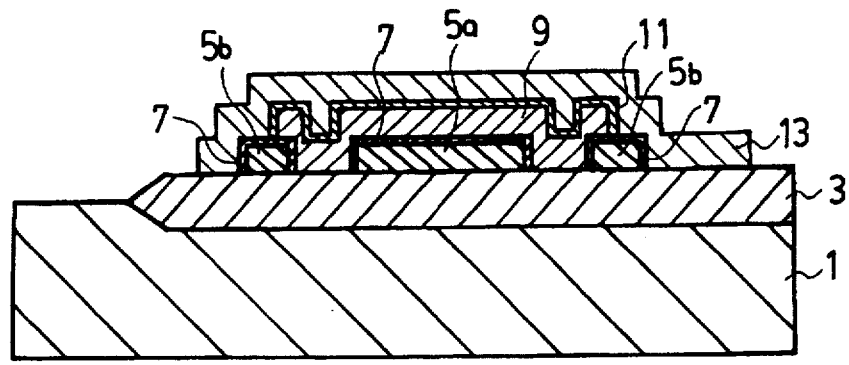

Afterward, the thus-patterned photoreactive resin is used as an etching mask to etch the upper gate electrode material 12 in order to form the upper gate electrode 13 as shown in FIG. 19. To form the upper gate electrode 13, an upper gate electrode material 12 made of a polycrystalline silicon film is specifically etched and patterned in the reactive ion etching system, using as an etching gas a mixed gas of sulfur hexafluoride ($SF_6$), chlorine ($Cl_2$), and difluoric methane ($CH_2F_2$).

During this process, the upper gate electrode 13 is formed into such patterns as shown in the plan view of FIG. 1, traversing the device region 9 in such a direction as to be orthogonal to both the first and second lower gate electrodes 5a and 5b.

Afterward, an N-type impurity is implanted in the entire device region 9. In this process, the upper gate electrode 13 placed on the gate region is used as a mask, so that the gate region remains a P-type semiconductor, whereas both the source region 15 and drain region 17, as shown in FIG. 1, on both sides of the gate region become an N-type semiconductor.

The source region 15 and drain region 17 are formed in the ion implanting system by implanting an N-type impurity, i.e. phosphorus (P), with an implanting energy of 60 keV and an ion implantation rate of $3 \times 10^{15}$ atoms/$cm^2$.

Figure 20:
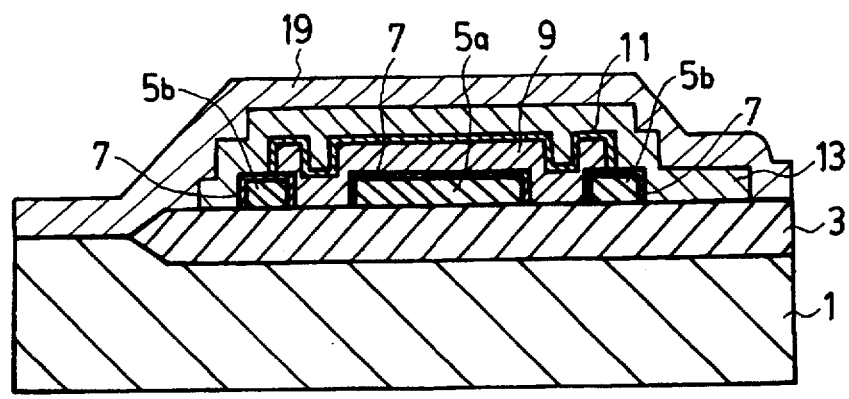

On the entire surfaces of the semiconductor substrate 1 is formed, as shown in FIG. 20, an inter-layer insulator film 19 made of silicon oxide containing phosphorus (P) and boron (B).

The inter-layer insulator film 19 is specifically formed to a thickness of 500 nm in the CVD system by using as a reaction gas a mixed gas of monosilane ($SiH_4$), phosphine ($PH_3$), and diborane ($B_2H_6$).

Afterward, an oxidation diffusion furnace is used to perform reflow processing on the substrate 1 to smooth the inter-layer insulator film 19 during heat treatment in the atmosphere of nitrogen at a temperature of 900° C. This reflow processing can not only smooth the inter-layer insulator film 19 but also activate an impurity of phosphorus implanted into source region 15 and drain region 17.

A photoreactive resin (not shown) is then formed on the entire upper surfaces of the inter-layer insulator film 19 by the rotational application method. Afterward, a prescribed mask is used to perform photoetching processes comprising exposure and development, so that the photoreactive resin is patterned so as to form openings in regions where the contact holes 21a to 21e indicated by the imaginary lines are to be formed.

Figure 21:
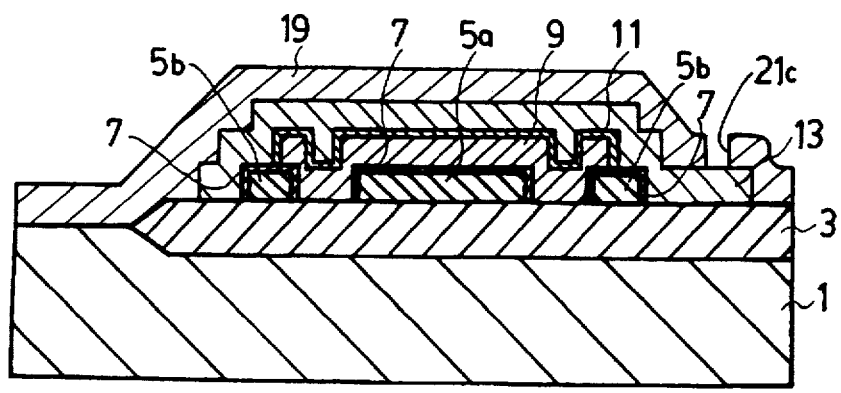

Then, the thus-patterned photoreactive resin is used as an etching mask to perform dry etching on the inter-layer insulator film 19, so that the contact holes 21a to 21e, only contact hole 21c which is shown in FIG. 21, are formed.

In order to form the contact holes 21a to 21e, the inter-layer insulator film 19 is specifically etched in the reactive ion etching system by using as an etching gas a mixed gas of difluoromethane ($CH_2F_2$) and trifluoromethane ($CHF_3$).

Subsequently, on the entire upper surfaces of the semiconductor substrate 1 is formed an aluminum film, as a wiring material, containing silicon and copper. This wiring material is formed in the sputtering system to a thickness of 700 nm.

A photoreactive resin (not shown) is then formed throughout on the upper surfaces of that wiring material by means of the rotational application method. And then, a prescribed mask is used to perform photoetching processes comprising exposure and development, patterning the photoreactive resin so as to form necessary openings in regions where the wiring 23 shown in FIG. 2 is expected to be formed.

The thus patterned photoreactive resin is used as an etching mask to perform dry etching on the wiring material so that the wiring 23 can be formed. To form the wiring 23, the aluminum film containing silicon and copper is specifically etched in the reactive ion etching system by using as an etching gas a mixed gas of chlorine ($Cl_2$) and boron trichloride ($BCl_3$).

The photoreactive resin used as an etching mask is thereafter removed, to make it possible to form an FET having the first lower gate electrode 5a and the second lower gate electrode 5b as well as the upper gate electrode 13 via the device region 9. This finished product is shown in the cross-sectional view of FIG. 2.

Figure 22:
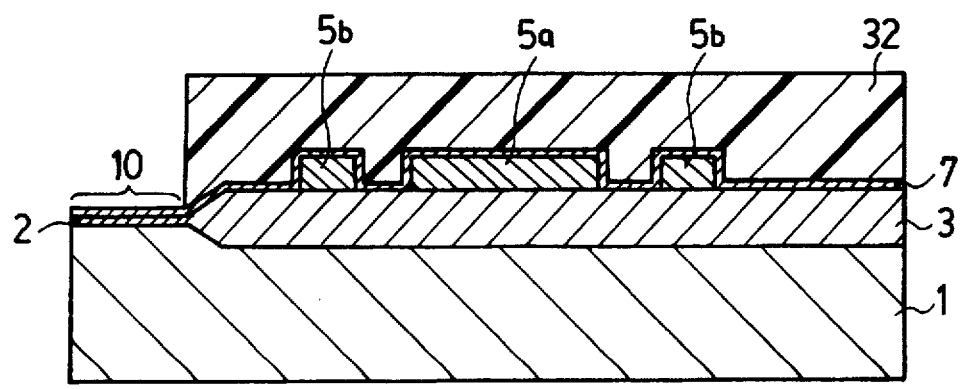
FIGS. 22 and 23 are cross-sectional views illustrating processes, like those of FIGS. 12 and 16, for explaining a method of manufacturing a semiconductor device according to a second embodiment of the present invention.
Figure 23:
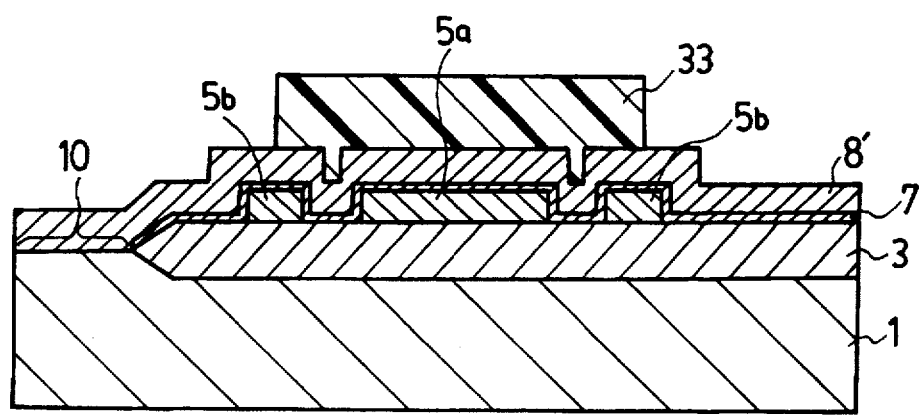
Figure 24:
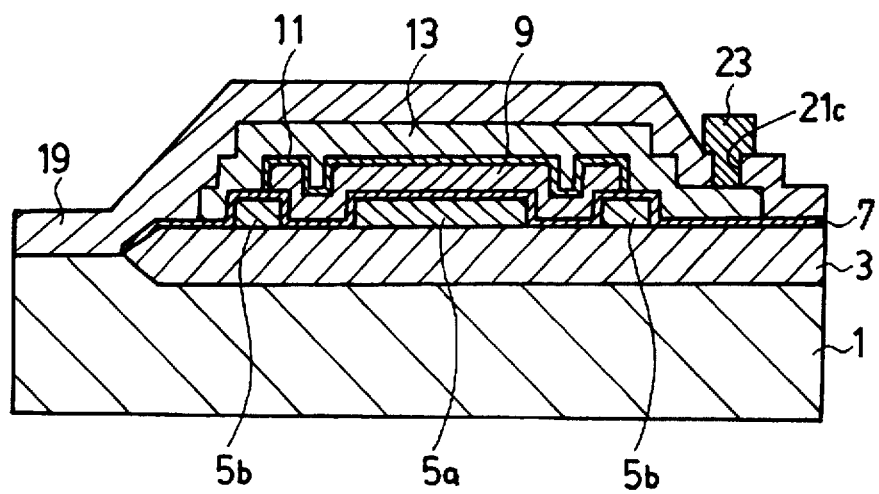
FIG. 24 is a cross-sectional view, like FIG. 2, illustrating a finished state of the semiconductor device according to the second embodiment of the present invention.

[Second Embodiment: FIGS. 22 to 24]

Reference is now made to cross-sectional views of FIGS. 22 to 24, in order to describe a structure and a manufacturing method of the semiconductor device according to a second embodiment of the present invention. Throughout those figures, the same reference numerals as in FIGS. 1, 2, and 4 to 21 are given to the same or similar parts and elements.

The second embodiment differs from the first embodiment in both the structure and the manufacturing method of the lower gate insulator film. The other structures and the actions/effects are the same as the first embodiment.

That is, the first embodiment forms the lower gate insulator film 7 by oxidation, whereas the second embodiment forms the lower gate insulator film 7 by means of the CVD method.

Brief description will now be given of a method of manufacturing a semiconductor device according to the second embodiment of the present invention.

The same processes as those in the first embodiment described with reference to FIGS. 4 to 10 are performed to form, on the semiconductor substrate 1, the insulator film 3, throughout on which is formed the lower gate electrode material 6, whereupon photoetching is carried out to form the first lower gate electrode 5a and second lower gate electrode 5b as shown in FIG. 22.

Subsequently, in the CVD system, monosilane ($SiH_4$) and oxygen ($O_2$) are used as a reaction gas to form the lower gate insulator film 7 made of silicon oxide on the entire surface of the semiconductor substrate 1.

A photoreactive resin 32 is then formed on the entire surface of the lower gate insulator film 7 by the rotational application method, whereupon a predetermined mask is used to carry out photoetching processes comprising exposure and development, so that the photoreactive resin 32 may be patterned so as to allow openings to be formed in the seed region 10. FIG. 22 shows the processes up to this step.

Thereafter, the thus patterned photoreactive resin 32 is used as an etching mask to etch the lower gate insulator film 7 and the pad oxide film 2, so that the portions of semiconductor substrate 1 which exist in the seed region 10 may be exposed as shown in FIG. 23. The lower gate insulator film 7 and the pad oxide film 2 are specifically etched by a buffered hydrofluoric acid which is a mixed solution of hydrogen fluoride acid (HF) and ammonium fluoride ($NH_4F$).

The subsequent processes are the same as those in the manufacturing of a semiconductor according to the first embodiment.

That is, nonmonocrystalline silicon film 8 is formed on the entire surface of the semiconductor substrate 1 on which are in advance formed the insulator film 3, the first and second lower gate electrodes 5a and 5b, and the lower gate insulator film 7, and thereafter the substrate 1 undergoes two steps of heat treatment to transform nonmonocrystalline silicon film 8 into monocrystalline silicon film 8' and then is etched using a photoreactive resin 33 such as shown in FIG. 23, to form the device region 9 shown in FIG. 24.

The upper gate insulator film 11 is then formed on top of the device region 9 to form the upper gate electrode 13. Then, the inter-layer insulator film 19 is formed, followed by the formation of the contact holes 21a to 21e, where the wiring 23 is formed, so that via the device region, as shown in FIG. 24, an FET may be formed which has the first and second gate electrodes 5a and 5b and the upper gate electrode 13.

FIG. 23 is a cross-sectional view illustrating the steps similar to those shown in FIG. 16 for the first embodiment, while FIG. 24 is a similar cross-sectional view which shows the finished product of a semiconductor device according to the second embodiment.

In the semiconductor device of the above-mentioned second embodiment, the lower gate insulator film 7, which is formed with a silicon oxide film, may be provided using a silicon nitride film.

The lower gate insulator film 7 is specifically formed of silicon nitride by means of the CVD system in the atmosphere of a mixed gas of dichlorosilane ($SiH_2Cl_2$) and ammonia ($NH_3$) as a reaction gas at a temperature of 700° C.

A silicon nitride film used to form the lower gate insulator film 7 gives the following effects. That is, during the heat treatment of transforming the nonmonocrystalline silicon film 8 into the monocrystalline silicon film 8', there exists the lower gate insulator film 7 made of silicon nitride, between the film 8 and the underlying insulator film 3.

That silicon nitride film contains stoichiometry-wise an excess amount of silicon as compared to the silicon oxide film. For this reason, the boundary between the nonmonocrystalline silicon film and the silicon nitride film is stabilized, to decrease the number of defects in the device region 9 which acts as a continuous film, thus improving the quality of the device region film.

The occurrence of defects in the covering film of the device region 9 where a nonmonocrystalline silicon film is transformed into a monocrystalline silicon film is ascribed to the change in volume during the transformation into the monocrystalline silicon film and also to the imperfect bonding in the vicinity of the boundary between the nonmonocrystalline silicon film and the silicon oxide film.

Silicon bonds with oxygen at the boundary between the nonmonocrystalline silicon film and the silicon oxide film will occur at the time of replacement by stable bonds of the silicon oxide film. Therefore, distortion occurs when the nonmonocrystalline silicon film is replaced by the monocrystalline silicon film.

Moreover, the silicon oxide film acts so as to generate a compression stress to the semiconductor substrate 1, so that the stress is increased during high-temperature heat treatment, to produce distortion in the nonmonocrystalline silicon film on the silicon oxide film and also to produce voids in the vicinity of the unstable boundary.

To guard against this, a silicon nitride film provided below the nonmonocrystalline silicon film will decrease the stress in the entire covering film as well as that due to the surface reaction, to form a device region with a stable boundary and less defects.

Figure 25:
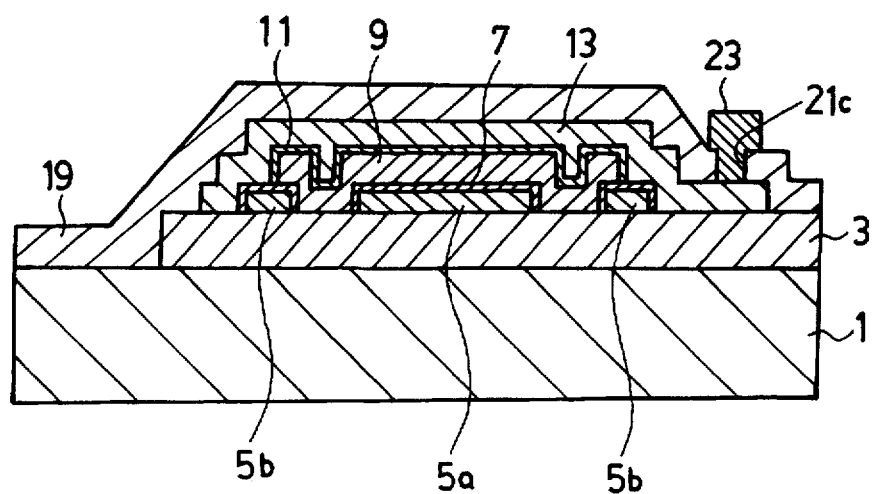
FIG. 25 is a cross-sectional view illustrating a finished state of a semiconductor device according to a third embodiment of the present invention.

[Third Embodiment: FIG. 25]

Referring to a cross-sectional view of FIG. 25, description will now be made of a structure and a manufacturing method of a semiconductor device according to a third embodiment of the present invention. In FIG. 25, which is a cross-sectional view like that shown in FIG. 2 and shows a finished product according to the third embodiment, the same parts and elements as in FIG. 2 are designated by the same or corresponding reference numerals.

The structure and the manufacturing method of a semiconductor device according to the third embodiment differ from those by the first and second embodiments.

That is, in the first and second embodiments, the insulator film 3 is formed by the local oxidation method, whereas in the third embodiment, the insulator film 3 is formed not by local oxidation processing but by overall oxidation processing.

More precisely, as shown in FIG. 25, the insulator film 3 made of silicon oxide is formed on the entire surface of the semiconductor substrate 1 made of monocrystalline silicon. The insulator film 3 made of silicon oxide is specifically formed to a thickness of 500 nm by undergoing oxidization in the atmosphere of oxygen.

Afterward, a photoreactive resin (not shown) is formed on the entire surface of the insulator film 3 by the rotational application method, to use a predetermined photomask so that the photoreactive resin may be patterned so as to be formed only in the portions where the insulator film 3 is expected to be formed.

Then, the thus patterned photoreactive resin is used as an etching mask to etch and pattern the insulator film 3 made of silicon oxide.

The details of the subsequent processes are omitted here because they are the same as those for the first embodiment.

Similar to the above-mentioned embodiments, the semiconductor device according to the third embodiment will also inhibit current leakage due to parasitic transistors and assure prescribed operations as a semiconductor device all the time.

Also in the third embodiment, like in the second embodiment, a silicon oxide film or a silicon nitride film may be provided as the lower gate insulator film 7 on the entire surfaces of the insulator film 3, the first and second lower gate electrodes 5a and 5b.

[Fourth Embodiment: FIGS. 26 to 37]

Referring to cross-sectional views of FIGS. 26 to 37, description will now be given of a structure and a manufacturing method of a semiconductor device according to a fourth embodiment of the present invention. Throughout those figures, the same reference numerals as those in FIGS. 2 and 4 to 21 are given to the same and similar parts and elements.

Figure 37:
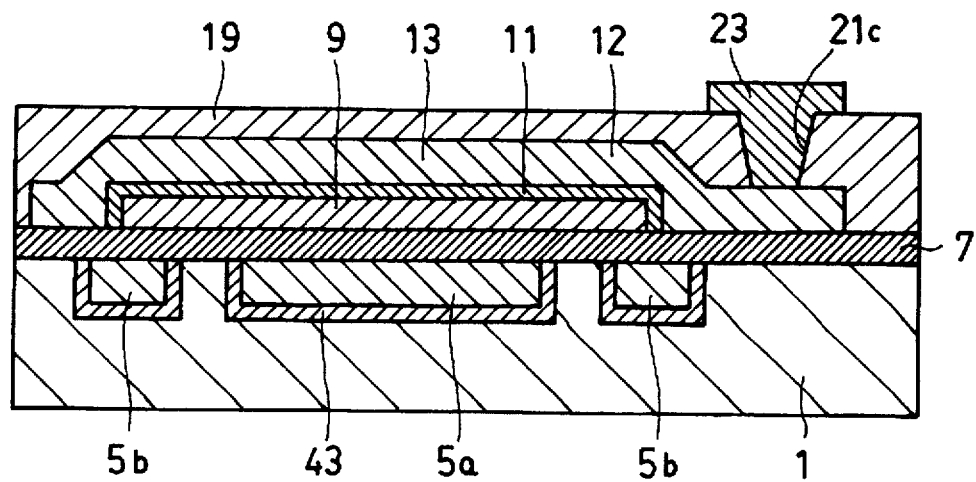
FIG. 37 is a cross-sectional view, like FIG. 2, illustrating a finished state of the semiconductor device according to the fourth embodiment of the present invention.
Figure 38:
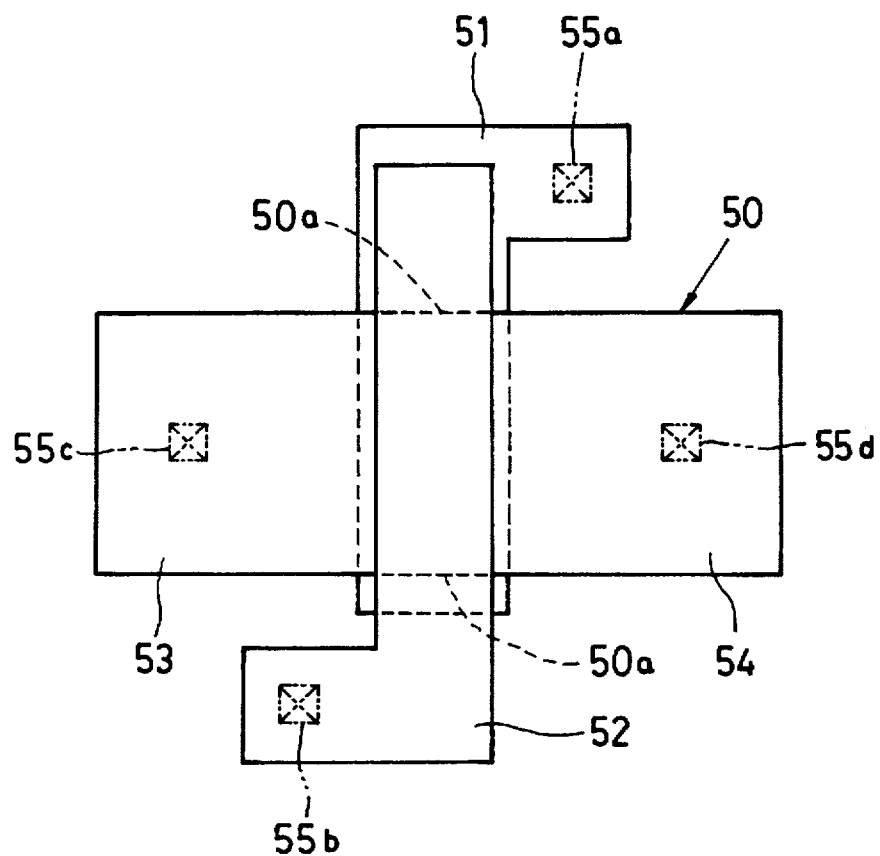
FIG. 38 is a top plan view, like FIG. 1, illustrating an example of the structure of a conventional semiconductor device.

FIG. 37 is a cross-sectional view similar to FIG. 2 that of the finished product of a semiconductor device according to the fourth embodiment, being the same as FIG. 1 used in the description of the first embodiment, with an exception that the plan view illustrating a relationship of arrangement of the device region, the lower gate electrodes, and the upper gate electrode is omitted.

Therefore, the structure of a semiconductor device according to the fourth embodiment is described below with reference to FIG. 37. In the fourth embodiment as well, like the other embodiments as set forth hereinabove, the first and second lower gate electrodes 5a and 5b make up the lower gate electrode, and on the lower gate insulator film 7 are provided the device region 9, the upper gate insulator film 11, and the upper gate electrode 13 to make up a semiconductor device. All the semiconductor elements formed on the common semiconductor substrate 1 are interconnected via the wiring 23 through the contact holes 21c or the like provided in the inter-layer insulator film 19.

The fourth embodiment differs from the first to third embodiments in that both the first lower gate electrode 5a and the second lower gate electrode 5b insulated from the semiconductor substrate 1 by an embedded insulator film 43 are also embedded into the substrate 1, so that the device region 9 is flat.

Referring to the plan view of FIG. 1 and cross-sectional views of FIGS. 26 to 37, description will now be given of a method of manufacturing an FET as a semiconductor device according to the fourth embodiment.

Figure 26:
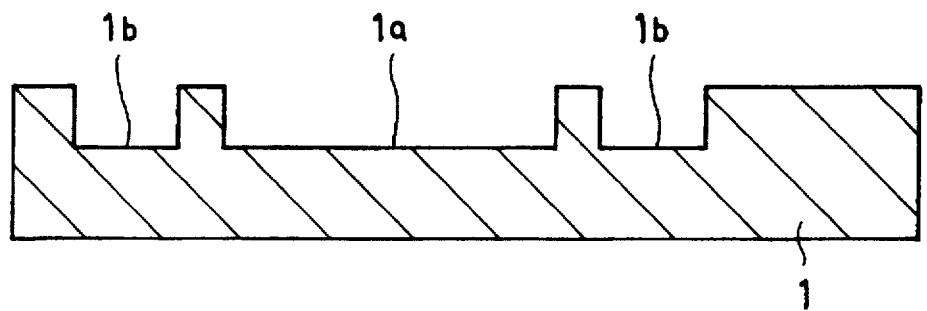
FIGS. 26 to 36 are cross-sectional views illustrating processes for explaining a method of manufacturing a semiconductor device according to a fourth embodiment of the present invention.

First, a photoreactive resin (not shown) is formed on the entire surface of the semiconductor substrate 1 made of monocrystalline silicon shown in FIG. 26 by the rotational application method. A predetermined mask is then used to carry out photoetching processes comprising exposure and development, so that the photoreactive resin is patterned to develop openings in the region where the substrate 1 is to be etched.

Then, that photoreactive resin is used as a photomask, to etch the semiconductor substrate 1 so that 350-nm deep grooves 1a and 1b may be formed in the substrate 1 as shown in FIG. 26. The semiconductor substrate 1 herein is specifically etched in the reactive ion etching system using a mixed gas of trifluoronitrogen ($NF_3$) and helium (He) as an etching gas.

Figure 27:
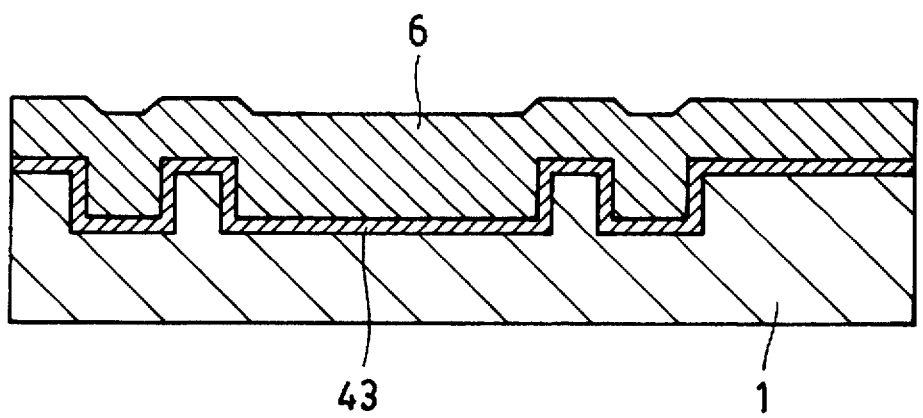

Subsequently, the photoreactive resin is removed, to oxidize the semiconductor substrate 1 in which the grooves 1a and 1b have been formed as shown in FIG. 26 so that the embedded insulator film 43 made of a 100 nm-thick silicon oxide film may be formed on the entire surface of the substrate 1 as shown in FIG. 27.

On the entire surface of the embedded insulator film 43 is formed the lower gate electrode material 6 having a thickness of 1500 nm made of polycrystalline silicon as shown in FIG. 27. The lower gate electrode material 6 made of polycrystalline silicon is specifically formed in the CVD system by using monosilane ($SiH_4$) as a reaction gas.

Figure 28:
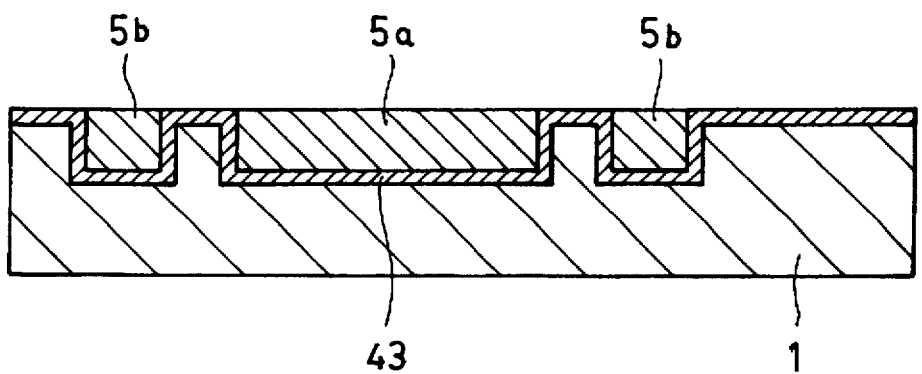

Afterward, as shown in FIG. 28, the surfaces of the lower gate electrode material 6 are ground and smoothed by a grinder until the upper surface of the embedded insulator film 43 may be exposed. The first and second gate electrodes 5a and 5b are thus formed.

Figure 29:
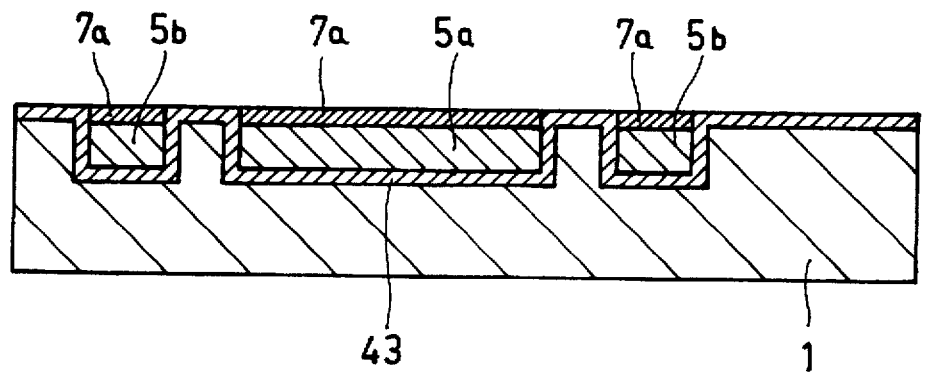

As shown in FIG. 29, a first lower gate insulator film 7a made of silicon oxide is formed on the entire surfaces of the first and second lower gate electrodes 5a and 5b. The lower gate insulator film 7a made of silicon oxide is specifically formed to a thickness of 20 nm during its overall oxidization at a temperature of 900° C. in the atmosphere of a mixed gas of oxygen and nitrogen. At the same time, the exposed surfaces of the embedded insulator film 43 are also oxidized with little increase in the film thickness, whose illustration is therefore omitted in FIG. 29.

Figure 30:
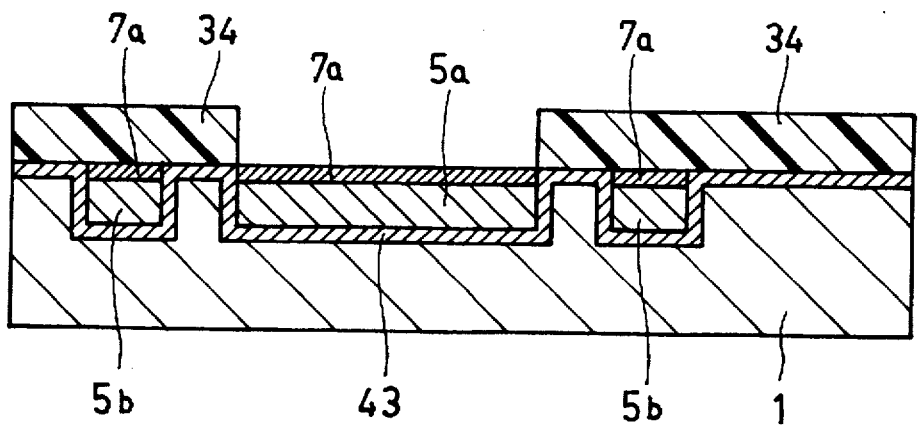

Thereafter, as shown in FIG. 30, a photoreactive resin 34 is formed on the surfaces of the embedded insulator film 43 and the first gate insulator film 7a by the rotational application method. And then, a predetermined photomask is used to carry out photoetching processes comprising exposure and development so that the photoreactive resin 34 may be formed so as to develop openings in the necessary portions of the first lower gate electrode 5a.

Then, the photoreactive resin 34 is used as a mask to use the ion implanting system, which implants an N-type impurities of phosphorus (P) into the first lower gate electrode 5a at an ion implantation rate of $1 \times 10^{16}$ atoms/cm². This makes the first lower gate electrode 5a an N-type semiconductor. Thereafter, the photoreactive resin 34 is removed.

Figure 31:
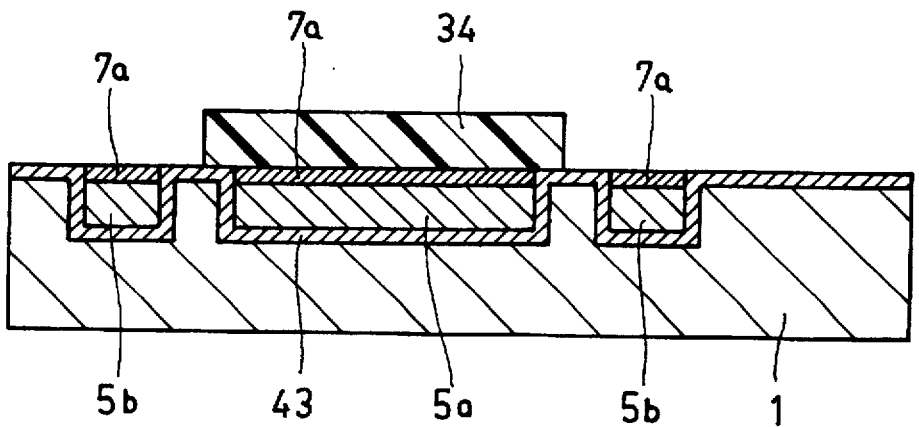

Then, as shown in FIG. 31, the photoreactive resin 34 is formed again on top of the surfaces of the embedded insulator film 43 and the first lower gate insulator film 7a by means of the rotational application method. A predetermined photomask is then used to carry out photoetching processes comprising exposure and development, so that photoreactive resin 34 may be formed so as to cover only the portions of the first lower gate electrode 5a.

Then, the photoreactive resin 34 is used as a mask to use the ion implanting system, which implants a P-type impurity of boron (B) into the second lower gate electrode 5b at an ion implantation rate of $3 \times 10^{15}$ atoms/cm². This makes the second lower gate electrode 5b a P-type semiconductor. Thereafter, the photoreactive resin 34 is removed.

Figure 32:
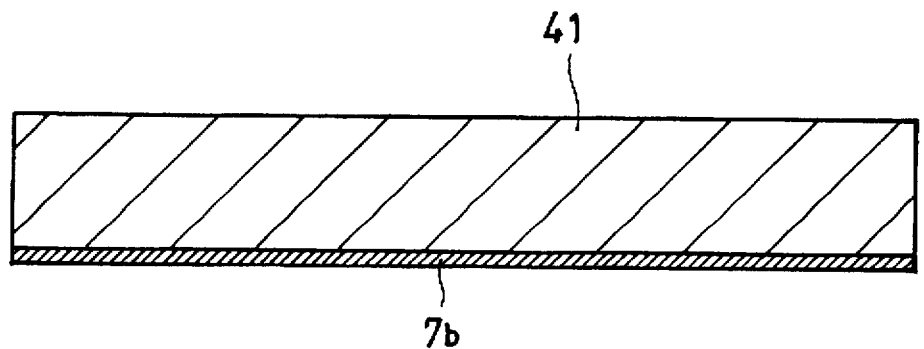

As shown in FIG. 32, a second semiconductor substrate 41 is then oxidized in the oxidizing atmosphere, to form the second lower gate insulator film 7b made of silicon oxide. The second lower gate insulator film 7b is specifically formed to a 50 nm-thick silicon oxide film by undergoing oxidization at a temperature of 900° C. in the atmosphere of a mixed gas of oxygen and nitrogen.

Figure 33:
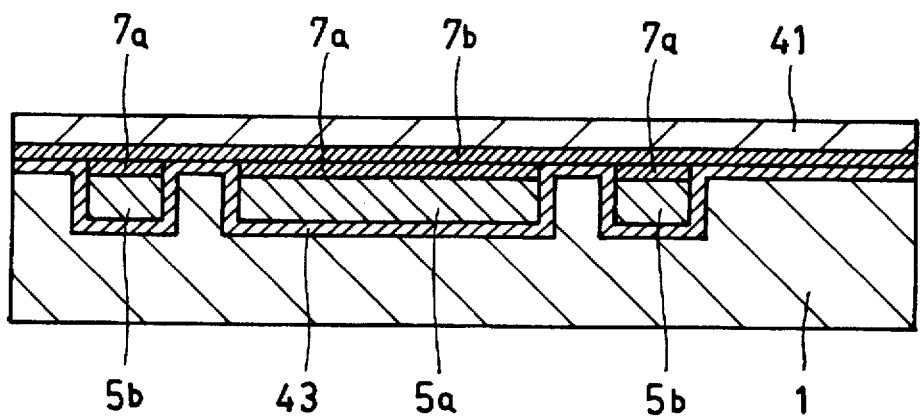

Afterward, as shown in FIG. 33, the lower gate insulator film 7a provided on the surface of the semiconductor substrate 1 is joined to the embedded insulator film 43 and the second lower gate insulator film 7b provided in the second semiconductor substrate 41. This joining is made in such a close placing as to utilize the intermolecular force between both substrates at room temperature. Then, it undergoes 60 minutes of heat treatment in the atmosphere of nitrogen heated to a temperature of 800° C. and then 120 minutes of heat treatment in the 1100° C. atmosphere of nitrogen.

As a result of this, the first lower gate insulator film 7a and the embedded insulator film 43 are joined to the lower gate insulator film 7b to put together the semiconductor substrate 1 and the second semiconductor substrate 41.

This joining process forms the lower gate insulator film 7 by joining the substrate 1 to the second substrate 41 and also by joining the first lower gate insulator film 7a and the embedded insulator film 43 to the second lower gate insulator film 7b.

The second semiconductor substrate 41 is reversed, whose surface is then ground by a grinder until the film thickness of the second semiconductor substrate 41 becomes 300 nm.

In order to obtain the second semiconductor substrate 41 having a film thickness of 300 nm, etching may be employed instead of grinding.

A P-type impurity of boron is then implanted on the entire surface of the second semiconductor substrate 41 at an ion implantation rate of $5 \times 10^{12}$ atoms/cm². This makes the second semiconductor substrate 41 a P-type semiconductor.

Figure 34:
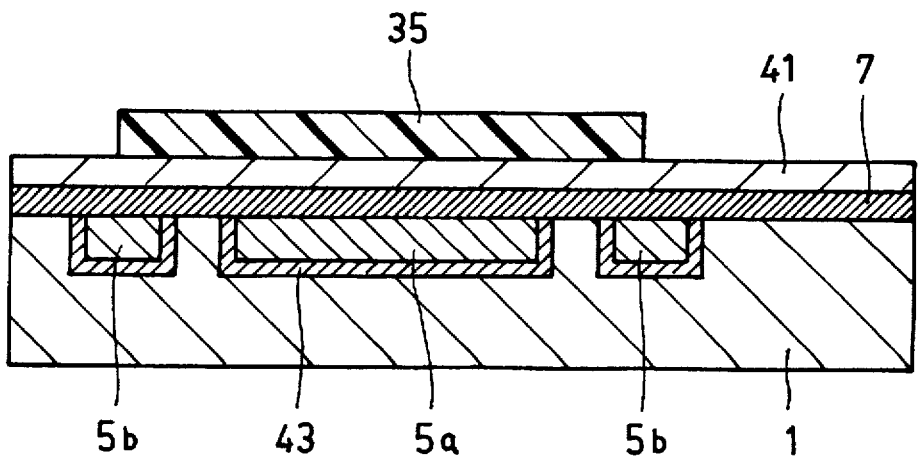

As shown in FIG. 34, a photoreactive resin 35 is thus formed by the rotational application method. And then, a prescribed photomask is used to carry out photoetching processes comprising exposure and development, for such patterning as to form the photoreactive resin 35 only in those areas where the device region is expected to be formed.

Subsequently, the photoreactive resin 35 is used as a mask, to etch the second semiconductor substrate 41 so that the device region 9 shown in FIG. 35 may be formed. This etching processing is specifically performed by the reactive ion etching system using a mixed gas of trifluoromethane (CHF₃), hexafluorosulfur (SF₆), and helium (He) as an etching gas. The photoreactive resin 35 is then removed.

Thereafter, the device undergoes oxidization in the atmosphere of oxygen, to form the upper gate insulator film 11 made of silicon oxide in the surface of the device region 9. The upper gate insulator film 11 is specifically formed to a film thickness of 10 nm silicon oxide by oxidization at a temperature of 900° C. in the atmosphere of a mixed gas of oxygen and nitrogen.

Figure 35:
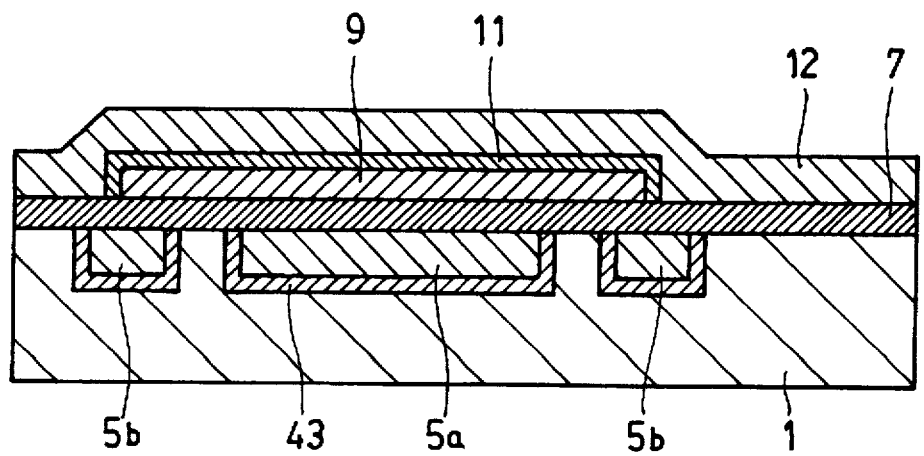

Subsequently, as shown in FIG. 35, the entire surface is formed with the upper gate electrode material 12 made of polycrystalline silicon. The upper gate electrode 12 made of polycrystalline silicon is formed to a thickness of 300 nm in the CVD system using monosilane (SiH₄) as a reaction gas.

Figure 36:
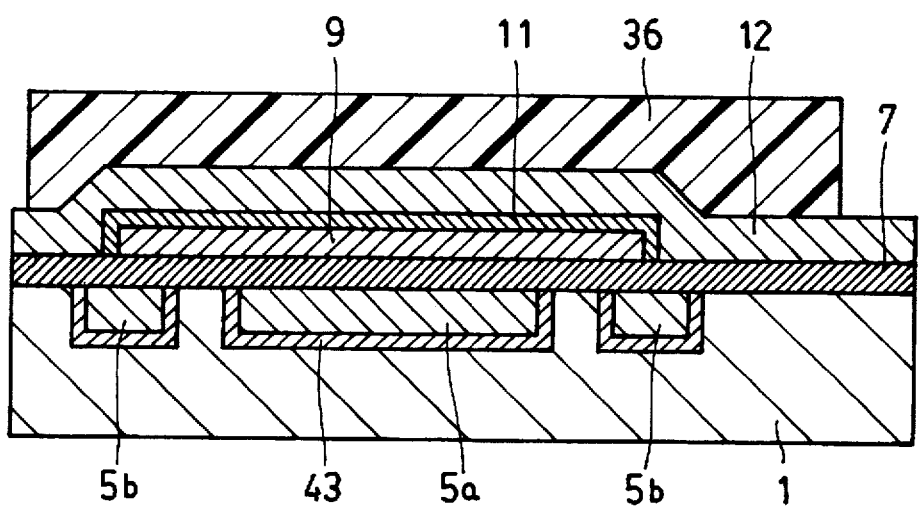

A photoreactive resin 36 is then formed on the entire surface of the upper gate electrode material 12 by means of the rotational application method. A predetermined photomask is then used, to carry out photoetching processes comprising exposure and development for such patterning as to form photoreactive resin 36 in the regions where the upper gate electrode is expected to be formed, as shown in FIG. 36.

Afterward, the thus patterned photoreactive resin 36 is used as an etching mask, to etch the upper gate electrode material 12 so that the upper gate electrode 13 shown in FIG. 37 is formed. This etching processing for the polycrystalline silicon film is actually carried out by the reactive ion etching system using as an etching gas a mixed gas of hexafluorosulfur (SF₆), chlorine (Cl₂), and difluoromethane (CH₂F₂), to pattern the upper gate electrode material 12.

It is to be noted that the upper gate electrode 13 is so patterned, as shown in the plan view of FIG. 1, as to cross over the device region 9 in a direction orthogonal to both the first lower gate electrode 5a and the second lower gate electrode 5b.

Thereafter, an N-type impurity of arsenic (As) is implanted on the entire surface of the device region 9, to form the N-type source region 15 and the drain region 17 as shown in FIG. 1. In this process, the upper gate electrode 13 acts as a mask, so that the portion (gate region) covered by the upper gate electrode 13 formed in the device region 9 remains a P-type region. The source region 15 and the drain region 17 are formed by the ion implanting system under the conditions of an arsenic (As) implanting energy of 60 keV and an ion implantation rate of $3 \times 10^{15}$ atoms/cm².

And then, as shown in FIG. 37, the entire surface is covered with the inter-layer insulator film 19 which is made of a silicon oxide film containing phosphorus (P) and boron (B). The inter-layer insulator film 19 is actually formed to a thickness of 500 nm in the CVD system using a mixed gas of monosilane (SiH₄), phosphine (PH₃), and diborane (B₂H₆) as a reaction gas.

Afterward, the oxidation diffusion furnace is used to carry out heat treatment in the atmosphere of nitrogen at a temperature of 900° C. in order to perform reflow processing so that the surface of the inter-layer insulator film 19 is smoothed. This heat treatment in the atmosphere of nitrogen, i.e. reflow processing, may also activate, at the same time as such smoothing, an impurity of arsenic implanted into the source region 15 and the drain region 17.

The subsequent processes, like in the case of the first embodiment, use a photoreactive resin and appropriate photomasks to form the contact holes 21c and others in the inter-layer insulator film 19, where the aluminum wiring 23 is formed to connect the electrodes with those of other semiconductor devices.

The above-mentioned embodiments have intended to apply different values of bias voltage onto the first and second lower gate electrodes 5a and 5b so as to inhibit current leakage due to the parasitic transistors formed at the edges of the device region.

However, the fourth embodiment is configured to give different conduction types to the first and second lower gate electrodes 5a and 5b, so that the same effects as those of the above-mentioned embodiments can be obtained even if the same voltage is applied to those first and second lower gate electrodes 5a and 5b.

In contrast with the above-mentioned N channel-type semiconductors, in which the first lower gate electrode 5a is N-type but the second lower gate electrode 5b is P-type, a P channel-type semiconductor device employs the first lower gate electrode 5a of a P-type conduction and the second lower gate electrode 5b of an N-type conduction.

A mask oxide film made of silicon oxide may be provided on top of the surface of the upper gate electrode 13 in the above-mentioned embodiments of the present invention. If this mask oxide film is formed on top of the surface of the upper gate electrode 13, then impurities contained in the covering film of the inter-layer insulator film 19 will be diffused into the device region 9 immediately below the upper gate electrode 13, to cause the mask oxide film to act as a stopper which prevents the FET's threshold voltage from fluctuating.

As is apparent from the above description, the semiconductor device according to the present invention has a lower gate electrode consisting of the first gate electrode and the second gate electrode. The first lower gate electrode is positioned in substantially the middle part in the width-direction of the device region, while the second lower gate electrode is provided along the boundary between the device region and the insulator film so as to cover the edges of the device region.

To the second lower gate electrode provided to cover the device region's edges, such a bias voltage is applied as to shift the threshold voltage of parasitic transistors toward an enhancement region. To the first lower gate electrode provided in substantially the middle part of the device region, such a bias voltage is applied as to control the threshold voltage of the FETs in the main surface of the device region.

As a result, a semiconductor device according to the present invention can inhibit the occurrence of current leakage which may otherwise be caused by parasitic transistors formed at the edges of the device region, to thereby assure the prescribed operations of the semiconductor device all the time.

What is claimed is:

1. A semiconductor device comprising:
   an insulator film disposed on a semiconductor substrate;
   a lower gate electrode disposed on said insulator film;
   a lower gate insulator film disposed on said lower gate electrode;
   a device region disposed on said lower gate insulator film;
   an upper gate insulator film disposed on said device region; and
   an upper gate electrode disposed on said upper gate insulator film,
   wherein
   said device region has island-shaped patterns;
   said lower gate electrode includes a first lower gate electrode and a second lower gate electrode;
   said first lower gate electrode is positioned in substantially the middle part of said device region;
   said second lower gate electrode is positioned in parallel with said first lower gate electrode and at a boundary between said device region and said insulator film; and
   said upper gate electrode extends orthogonal to said lower gate electrode.

2. A semiconductor device as claimed in claim 1, wherein a seed region is disposed in such a way as to surround said insulator film on said semiconductor substrate.

3. A semiconductor device as claimed in claim 1, wherein said insulator film and said lower gate electrode on said insulator film are embedded in said semiconductor substrate, so that said device region is flat.

4. A semiconductor device as claimed in claim 1, wherein said second lower gate electrode is disposed along two sides opposing each other at the boundary between said device region and said insulator film.

5. A semiconductor device as claimed in claim 2, wherein said second lower gate electrode is disposed along two sides opposing each other at a boundary between said device region and said insulator film.

6. A semiconductor device as claimed in claim 3, wherein said second lower gate electrode is disposed along two sides opposing each other at a boundary between said device region and said insulator film.

7. A semiconductor device as claimed in claim 1, wherein said lower gate insulator film is made of a silicon oxide film or a silicon nitride film.

8. A semiconductor device as claimed in claim 2, wherein said lower gate insulator film is made of a silicon oxide film or a silicon nitride film.

9. A semiconductor device as claimed in claim 3, wherein said lower gate insulator film is made of a silicon oxide film or a silicon nitride film.

10. A semiconductor device as claimed in claim 1, wherein said first lower gate electrode and said second lower gate electrode have different conduction types.

11. A semiconductor device as claimed in claim 2, wherein said first lower gate electrode and said second lower gate electrode have different conduction types.

12. A semiconductor device as claimed in claim 3, wherein said first lower gate electrode and said second lower gate electrode have different conduction types.

13. A semiconductor device as claimed in claim 10, wherein said semiconductor device is of an N-channel type, said first lower gate electrode is of an N-type conduction, and said second lower gate electrode is of a P-type conduction.

14. A semiconductor device as claimed in claim 10, wherein said semiconductor device is of a P-channel type, said first lower gate electrode is of a P-type conduction, and said second lower gate electrode is of an N-type conduction.

15. A semiconductor device as claimed in claim 11, wherein said semiconductor device is of an N-channel type, said first lower gate electrode is of an N-type conduction, and said second lower gate electrode is of a P-type conduction.

16. A semiconductor device as claimed in claim 11, wherein said semiconductor device is of a P-channel type, said first lower gate electrode is of a P-type conduction, said second lower gate electrode is of an N-type conduction.

17. A semiconductor device as claimed in claim 12, wherein said semiconductor device is of an N-channel type, said first lower gate electrode is of an N-type conduction, and said second lower gate electrode is of a P-type conduction.

18. A semiconductor device as claimed in claim 12, wherein said semiconductor device is of a P-channel type, said first lower gate electrode is of a P-type conduction, and said second lower gate electrode is of an N-type conduction.

* * * * *